United States Patent [19]
Ohno

[11] Patent Number: 5,218,323
[45] Date of Patent: Jun. 8, 1993

[54] TRANSISTOR DIRECT-COUPLED AMPLIFIER

[75] Inventor: Masahiko Ohno, Tokyo, Japan

[73] Assignee: NEC Corporation, Tokyo, Japan

[21] Appl. No.: 865,470

[22] Filed: Apr. 9, 1992

[30] Foreign Application Priority Data

Apr. 11, 1991 [JP] Japan .................................. 3-78086

[51] Int. Cl.⁵ ............................................. H03F 1/30
[52] U.S. Cl. .................................... 330/290; 330/311
[58] Field of Search ............... 330/289, 290, 296, 311, 330/294

[56] References Cited

U.S. PATENT DOCUMENTS

| | | | |
|---|---|---|---|
| 3,452,281 | 6/1969 | Weischedel | 330/289 |
| 3,729,588 | 4/1973 | Berland | 330/290 X |
| 3,899,742 | 8/1975 | Yum et al. | 330/290 |
| 4,511,857 | 4/1985 | Gunderson | 330/311 |

FOREIGN PATENT DOCUMENTS 1094807 12/1960 Fed. Rep. of Germany.
3107581 2/1988 Fed. Rep. of Germany.

*Primary Examiner*—Steven Motiola
*Attorney, Agent, or Firm*—Sughrue, Mion, Zinn, Macpeak & Seas

[57] ABSTRACT

A transistor direct-coupled amplifier includes a positive-phase direct-coupled amplifier circuit, a second transistor, and a low-pass filter. The positive-phase direct-coupled amplifier circuit uses a base of a first transistor as an input terminal. The second transistor has a collector connected to the input terminal of the positive-phase direct-coupled amplifier circuit and an emitter connected to a reference voltage source, and the second transistor is complementary with the first transistor. A low-pass filter receives an output from the positive-phase direct-coupled amplifier circuit as an input, and the low-pass filter is connected to feed back an output to a base of the second transistor.

4 Claims, 1 Drawing Sheet

TRANSISTOR DIRECT-COUPLED AMPLIFIER

BACKGROUND OF THE INVENTION

The present invention relates to an amplifier and, more particularly, to a transistor direct-coupled amplifier for amplifying a DC balanced signal.

In general, despite the many types of monolithic ICs known as wide-range amplifiers, when these ICs are used as wide-range amplifiers without matching their characteristics, they may not be suitable for wide-range amplifying applications because they offer no degree of design freedom. In contrast to this, in an amplifier constituted by a combination of transistor circuits, a circuit can be designed to match the application purpose. Therefore, this latter type of amplifier is frequently used in a video circuit and the like due to its high degree of design freedom.

In a conventional direct-coupled amplifier, in order to effectively use the dynamic range of an output voltage to reach a power source voltage, when an operating point is set to be about ½ the power source voltage, variable resistors are used in a bias circuit and adjusted to absorb variations in other transistors and resistors.

In the conventional direct-coupled amplifier, when the operating point is set to be about ½ the power source voltage, some of the resistors of the bias circuit must be changed into variable resistors VR11 to absorb variations in other transistors and resistors, thereby posing some problems in the manufacture of the amplifier. In addition, after the variable resistors are adjusted, the amplifier has no countermeasure against other changes over time, such as a change in power source voltage, and a change in temperature.

Especially, since a circuit having a high voltage gain has a small input signal level, the circuit is sensitive to a change in DC operating point caused by these changes, a signal clamping distortion is disadvantageously generated caused by a shift in the operating point. In order to prevent this, an output level must be set to be low, or a power source voltage must be increased. These limitations are drawbacks in use of the circuit.

SUMMARY OF THE INVENTION

It is an object of the present invention to provide a transistor direct-coupled amplifier capable of optimally setting an output operating point to an appropriate voltage at any time.

It is another object of the present invention to provide a transistor direct-coupled amplifier requiring no initial adjustment by a variable resistor.

It is still another object of the present invention to provide a transistor direct-coupled amplifier free from changes over time, like a change in power source voltage, and a change in temperature.

In order to achieve the above objects, according to the present invention, there is provided a transistor direct-coupled amplifier comprising a positive-phase direct-coupled amplifier circuit using a base of a first transistor as an input terminal, a second transistor having a collector connected to the input terminal of the positive-phase direct-coupled amplifier circuit and an emitter connected to a reference voltage source, the second transistor being complementary with the first transistor, and a low-pass filter for receiving an output from the positive-phase direct-coupled amplifier circuit as an input, the low-pass filter being connected to feed back an output to a base of the second transistor.

DESCRIPTION OF THE PREFERRED EMBODIMENT

An embodiment of the present invention will be described below with reference to the accompanying drawings.

Figure 1:
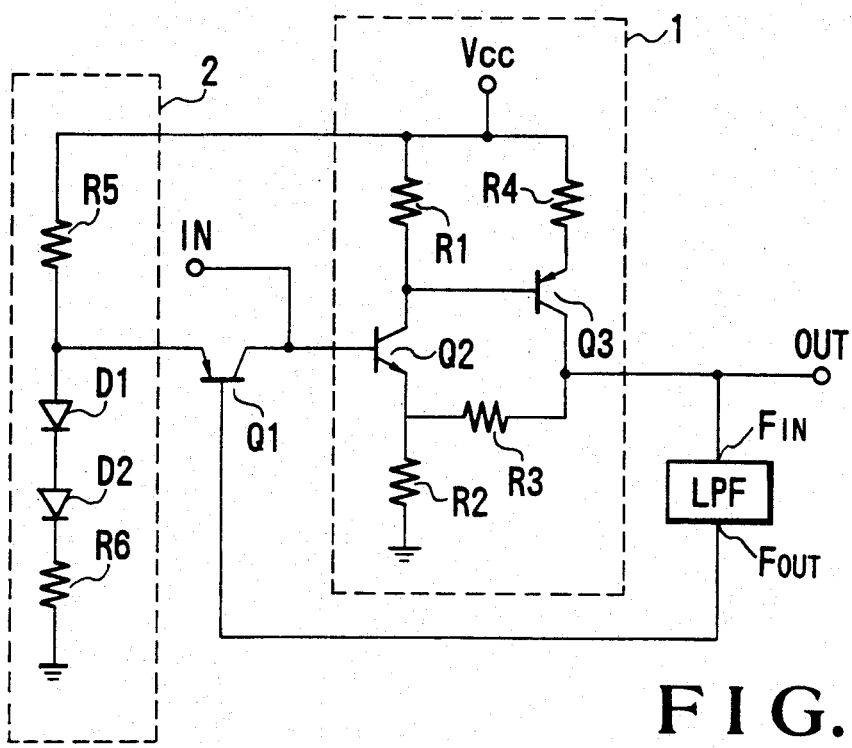
FIG. 1 is a circuit diagram showing an amplifier according to an embodiment of the present invention.
Figure 2:
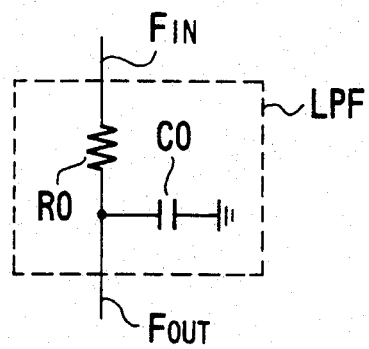
FIG. 2 is a circuit diagram showing a low-pass filter shown in FIG. 1 according to the embodiment of the present invention.

FIG. 1 is a circuit diagram showing an amplifier according to the embodiment of the present invention, and FIG. 2 is a circuit diagram showing a low-pass filter LPF of FIG. 1 having a resistor R0 and a capacitor C0. A positive-phase direct-coupled amplifier circuit 1 is constituted by an npn transistor Q2 and a pnp transistor Q3. That is, a collector output from the npn transistor Q2 is input to the base of the pnp transistor Q3, and the collector of the pnp transistor Q3 is connected to the emitter of the npn transistor Q2 through a resistor R3 and is negatively fed back. Assuming that $R1=R3=kR2=kR4$ (k is a constant $>> 1$, R1 to R4: resistances of the resistors R1 to R4, respectively), the gain of this circuit is about k times.

A reference power source circuit 2 is constituted by a series circuit. The series circuit is obtained such that two resistors R5 and R6 each having the same resistance and diodes D1 and D2 are arranged between a positive power source terminal $V_{cc}$ (voltage: $V_{cc}$) and ground. When the resistances of the resistors R5 and R6 are set to be low such that a change in voltage caused by an emitter current of the transistor Q1 can be neglected, a midpoint voltage of the diodes D1 and D2 goes to $V_{cc}/2$, and the emitter voltage of the pnp transistor Q1 goes to $V_{cc}/2+V_D$, where $V_D$ represents an ON voltage (about 0.6 V) of the diode D1.

An operation of the circuit will be described below. In the amplifier shown in FIG. 1, the pnp transistor Q1 is normally set in an ON state for the following reason. That is, if the pnp transistor Q1 is set in an OFF state, the npn transistor Q2 has no base current and is set in an OFF state, and the pnp transistor Q3 has no base current and is set in an OFF state. Therefore, currents from the two transistors Q2 and Q3 are not supplied to the resistors R2 and R3, respectively, the voltage of an output terminal OUT goes to 0 V, and an output voltage of 0 V appears at an output terminal $F_{out}$ of the low-pass filter LPF. At this time, a current path is formed by the power source $V_{cc}$, the resistor R5, the emitter-base path of the pnp transistor Q1, the output terminal $F_{out}$ of the low-pass filter LPF, a resistor R0 (FIG. 2) in the low-pass filter LPF, the input terminal $F_{IN}$ of the low-pass filter LPF, the resistor R3, the resistor R2, and ground in this order, and the pnp transistor Q1 is turned on. That is, the pnp transistor Q1 is not turned off but is normally set in an ON state.

An input signal to this amplifier is supplied to an input terminal IN through an input capacitor (not shown) so as to not influence the operating point of an input stage. A DC balanced signal (DC component=0) is used as the input signal, a voltage equal to a DC voltage at the operating point of the circuit output terminal is generated at the output of the low-pass filter LPF having a DC gain of 1 by removing a signal component. This voltage becomes the base voltage of the pnp transistor Q1, the value of the voltage is smaller than that of the emitter voltage by a base-emitter voltage $V_{BE}$ (about 0.6 V) of the pnp transistor Q1, and the value ($V_{cc}/2 + V_D - V_{BE}$) goes to about $V_{cc}/2$ by canceling the ON voltage $V_D$ of the diode D1 and the base-emitter voltage $V_{BE}$ of the pnp transistor Q1. That is, the operating point of the voltage at the output terminal OUT of the amplifier is $V_{cc}/2$. Therefore, the operating point is proportion to the value $V_{cc}$ in a change in power source voltage, and the operating point is always set to be $V_{cc}/2$.

In case of a change in temperature, since the ON voltage of the diode D1 and the base-emitter voltage $V_{BE}$ the pnp transistor Q1 have the same temperature coefficient, the changes in these voltages cancel each other. The operating point voltage of the circuit output terminal OUT is set to be $V_{cc}/2$.

When a power source is charged, if the operating point of the voltage at the circuit output terminal OUT is higher than $V_{cc}/2$, the output voltage of the low-pass filter LPF is higher than $V_{cc}/2$, thereby turning off the pnp transistor Q1. At this time, as described above, the voltage of the output terminal OUT of this amplifier is decreased to be stabilized at a point equal to $V_{cc}/2$.

Since the input impedance of the low-pass filter LPF is set to be higher than the output impedance of the positive-phase direct-coupled amplifier circuit, it will not influence the degree of voltage amplification, provided the condition that "the resistance of the resistor R0 >> the resistance of the resistor R3".

Figure 3:
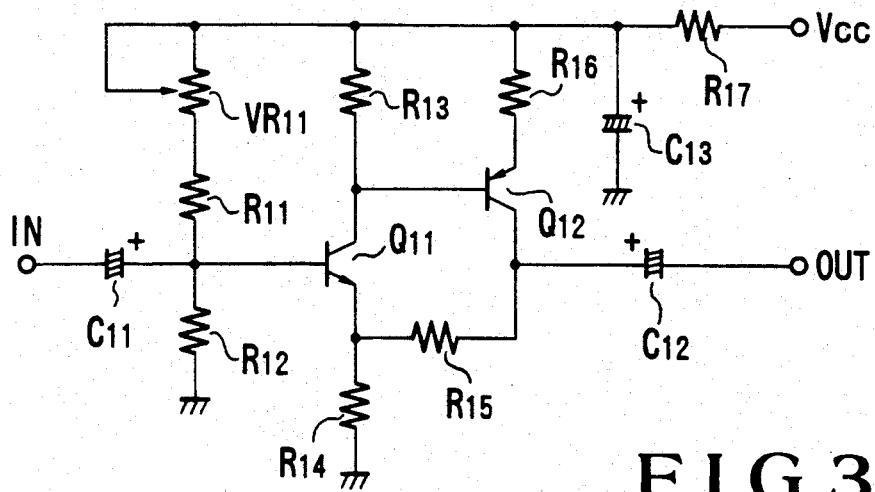
FIG. 3 is a circuit diagram showing a conventional amplifier.

FIG. 3 is a circuit diagram showing a conventional direct-coupled amplifier. In FIG. 3, a pnp transistor Q12 is used in the second stage of the amplifier to increase utilization efficiency of the power source voltage, and the amplifier has a circuit arrangement suitable for requiring a large output amplitude.

As described above, since optimal bias conditions are different in accordance with transistors used in the amplifier, a variable resistor VR11 is arranged in series with a resistor R11 to be adjusted.

As described above, according to the present invention, an output from the positive-phase direct-coupled amplifier circuit is fed back to an input stage through a low-pass filter to perform DC feedback. Therefore, an output operating point can be automatically set to be an optimal voltage (in many cases, about ½ the power source voltage) at any time. Initial adjustment performed by a variable resistor is not required, the output operating point can always be kept at an optimal setting point which is designated in advance in case of a change in power source voltage, a change in temperature, and a change in element value with time.

What is claimed is:

1. A transistor direct-coupled amplifier comprising:
   a reference voltage source;
   a positive phase direct-coupled amplifier circuit comprising a first transistor whose base constitutes an input terminal;
   a second transistor having a collector connected to the input terminal of said positive-phase direct-coupled amplifier circuit and an emitter connected to said reference voltage source, said second transistor being complementary with said first transistor; and
   a low-pass filter having an input coupled to an output of said positive-phase direct-coupled amplifier circuit, said low-pass filter being connected to feedback an output to a base of said second transistor, wherein said reference voltage source is constituted by a series circuit of first and second resistors connected between a power source and ground and a series circuit of first and second diodes connected in series between said first and second resistors, said emitter of said second transistor being connected between said first resistor and said first diode, and an ON voltage of said first diode and a base-emitter voltage of said second transistor being canceled to set an operating point of the output voltage of said positive-phase direct-coupled amplifier circuit to be a divided voltage obtained by dividing a power source voltage by said first and second resistors.

2. An amplifier according to claim 1, wherein said first and second resistors have the same resistance, and the operating point of the output voltage of said positive-phase amplifier circuit is set to be ½ the power source voltage.

3. An amplifier according to claim 1, wherein the ON voltage of said first diode and the base-emitter voltage of said second transistor have the same temperature coefficient.

4. A transistor direct-coupled amplifier comprising:
   a reference voltage source;
   a positive phase direct-coupled amplifier circuit comprising a first transistor whose base constitutes an input terminal;
   a second transistor having a collector connected to the input terminal of said positive-phase direct-coupled amplified circuit and an emitter connected to said reference voltage source, said second transistor being complementary with said first transistor; and
   a low-pass filter having an input coupled to an output of said positive-phase direct-coupled amplifier circuit, said low-pass filter being connected to feedback an output to a base of said second transistor, wherein said positive-phase direct coupled amplifier circuit is constituted by said first transistor of an npn type and a third transistor of a pnp type having a base connected to a collector of said first transistor, and a collector of said third transistor being connected to the base of said second transistor of the pnp type through said low-pass filter.

* * * * *